(12) United States Patent
Kanayama et al.

(10) Patent No.: US 7,838,177 B2
(45) Date of Patent: Nov. 23, 2010

(54) REFLECTION TYPE PHOTOMASK BLANK, REFLECTION TYPE PHOTOMASK, AND METHOD OF MANUFACTURING SEMICONDUCTOR DEVICE USING THE SAME

(75) Inventors: Koichiro Kanayama, Tokyo (JP); Tadashi Matsuo, Tokyo (JP); Yasushi Nishiyama, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 715 days.

(21) Appl. No.: 11/808,116

(22) Filed: Jun. 6, 2007

(65) Prior Publication Data

US 2007/0238033 A1 Oct. 11, 2007

Related U.S. Application Data

(63) Continuation of application No. PCT/JP2005/022375, filed on Dec. 6, 2005.

(30) Foreign Application Priority Data

Dec. 10, 2004 (JP) ............... 2004-358736
Sep. 21, 2005 (JP) ............... 2005-273487

(51) Int. Cl.
 *G03F 1/00* (2006.01)
 *G03F 7/00* (2006.01)

(52) U.S. Cl. .......................... 430/5; 430/311

(58) Field of Classification Search ........... 428/212, 428/430; 430/5, 311, 322
See application file for complete search history.

(56) References Cited

U.S. PATENT DOCUMENTS

2004/0175630 A1* 9/2004 Wasson et al. ............ 430/5
2005/0208389 A1* 9/2005 Ishibashi et al. ............ 430/5

FOREIGN PATENT DOCUMENTS

| EP | 1 498 936 A | 1/2005 |
|---|---|---|
| JP | 10-198023 | 7/1998 |
| JP | 2001-237174 | 8/2001 |
| JP | 2002-246299 | 8/2002 |
| JP | 2003-249434 | 9/2003 |
| JP | 2004-39884 | 2/2004 |
| JP | 2004-260050 | 9/2004 |

OTHER PUBLICATIONS

International Search Report of International Published Application No. PCT/JP2005/022375 (mailed Mar. 14, 2006).

International Preliminary Report on Patentability issued in International Application No. PCT/JP2005/022375, mailed on Jun. 21, 2007.

J.R. Wasson et al.: "Extreme ultraviolet mask fabrication with high inspection contrast TaSin$_x$ absorber stack", Journal of Vacuum Science & Technology B (Microelectronics and Nanometer Structures) AIP for American Vacuum Soc, USA, vol. 21, No. 6, Dec. 10, 2003, pp. 3086-3090, XP002512519, ISSN.

(Continued)

*Primary Examiner*—Stephen Rosasco
*Assistant Examiner*—Stewart A Fraser

(57) ABSTRACT

In a reflection type photomask blank having a multilayer reflection film and a light absorption laminated layer laminated on a substrate, the light absorption laminated layer is composed by laminating a second light absorption layer having DUV light absorbing capacity and containing at least one of nitrogen and oxygen, and tantalum and silicon, on a first light absorption layer having EUV light absorbing capacity and containing tantalum and silicon.

11 Claims, 6 Drawing Sheets

OTHER PUBLICATIONS

Cheng H-C et al.: "Enhanced Extreme Ultraviolet Lithography Mask Inspection Contrast Using Fabry-Perot Type Antireflective Coating", Japanese Journal of Applied Physics, Japan Society of Applied Physics, Tokyo, JP, vol. 43, No. 6B, Jun. 1, 2004, pp. 3703-3706, XP001232207, ISSN.

European Search Report issued on Feb. 18, 2009 in corresponding European Patent Application 05814171.4.

Japanese Office Action mailed May 18, 2010 and issued in corresponding Japanese Patent Application 2006-546706.

* cited by examiner

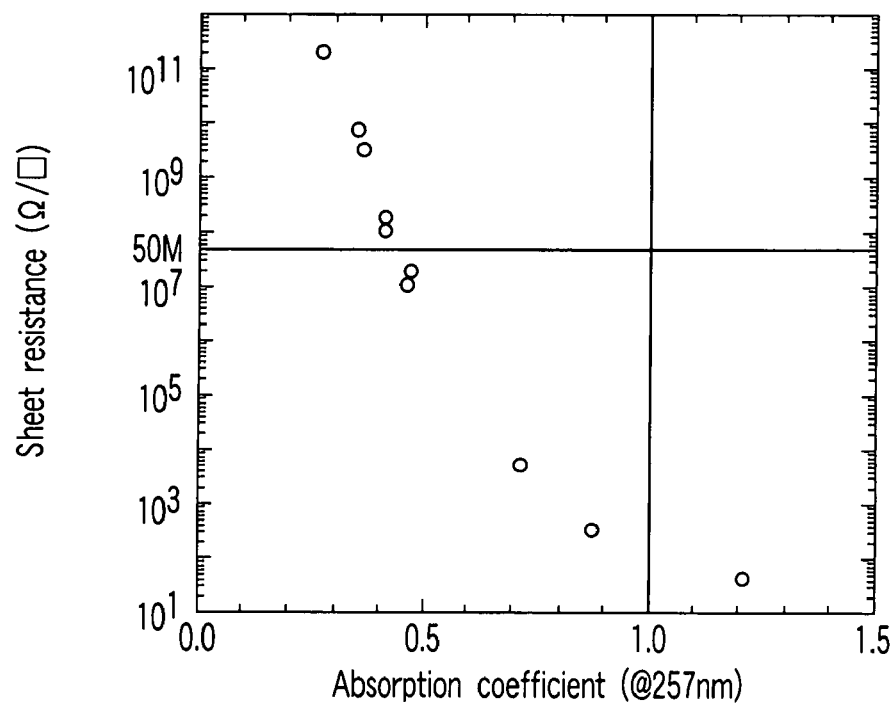
F I G. 6
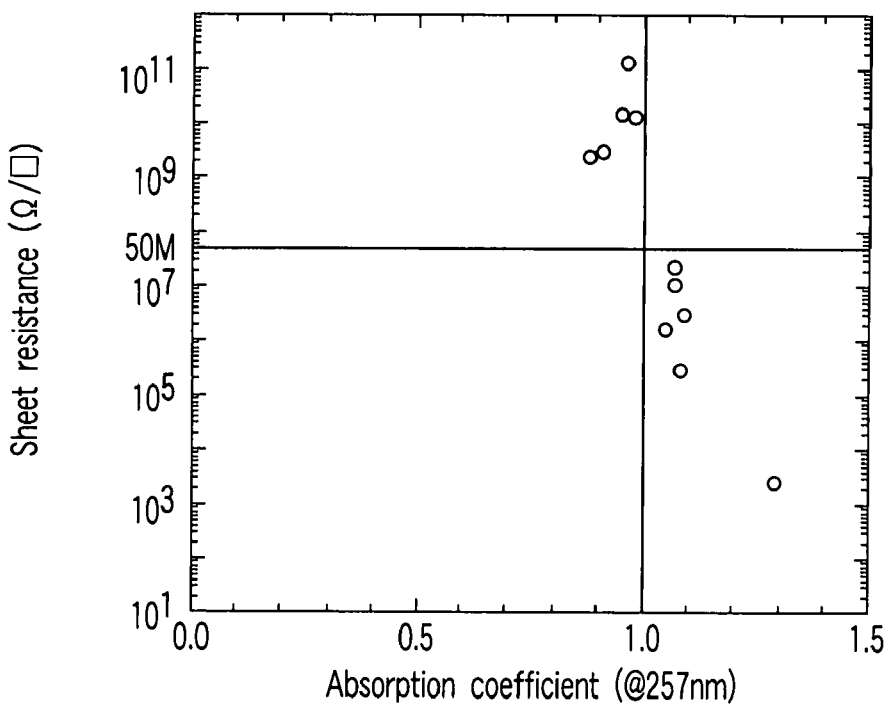
F I G. 7

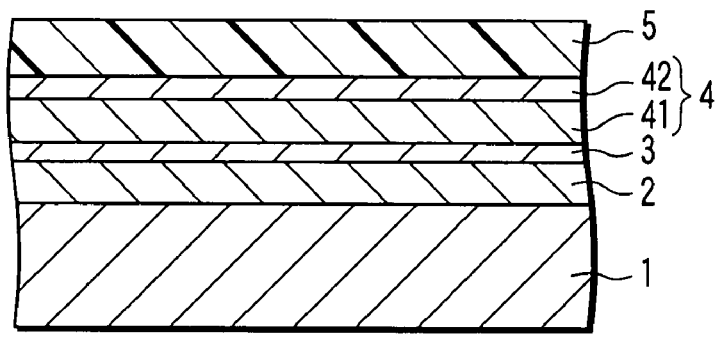
F I G. 10
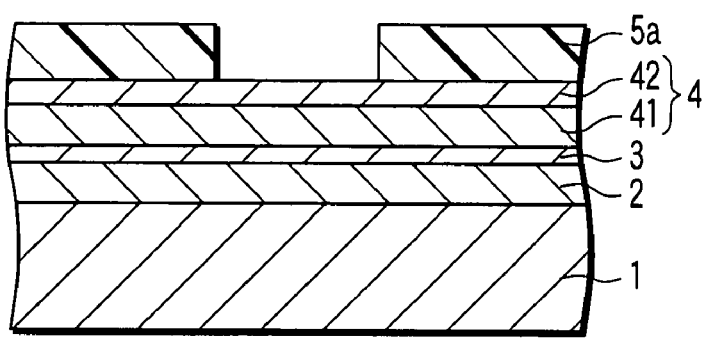
F I G. 11
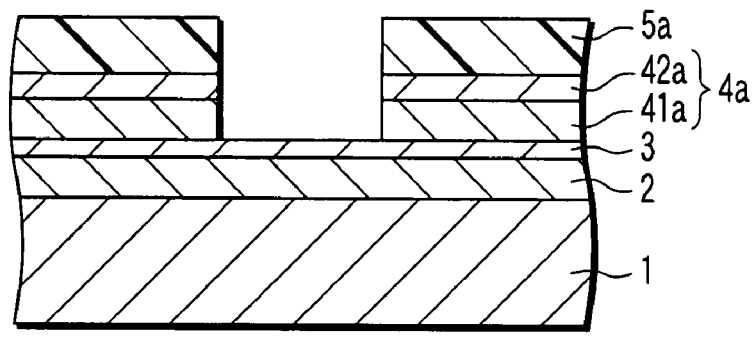
F I G. 12

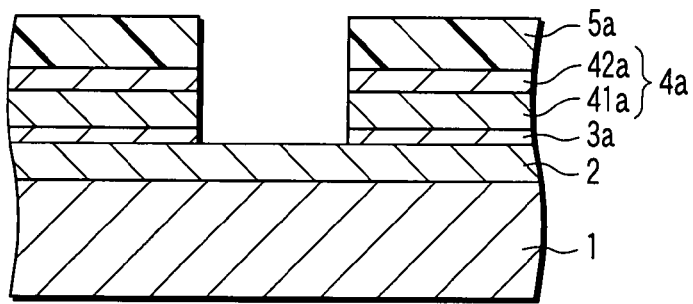
F I G. 13
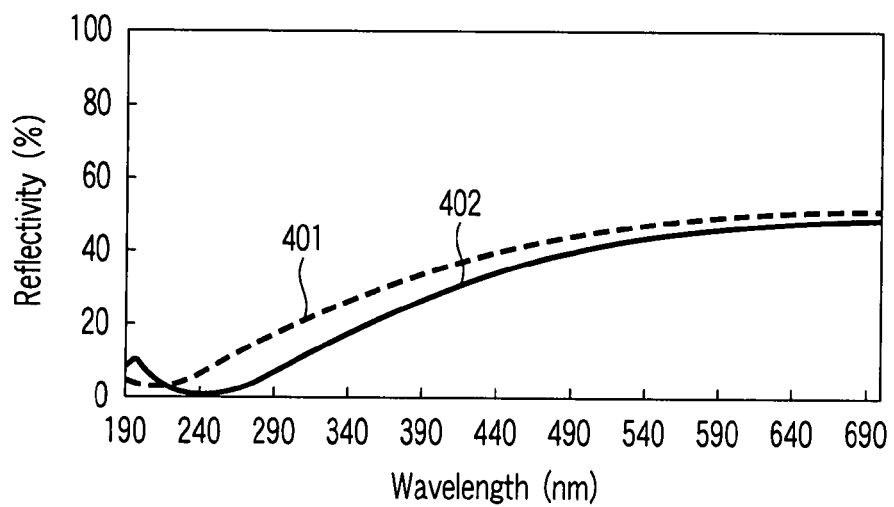
F I G. 14
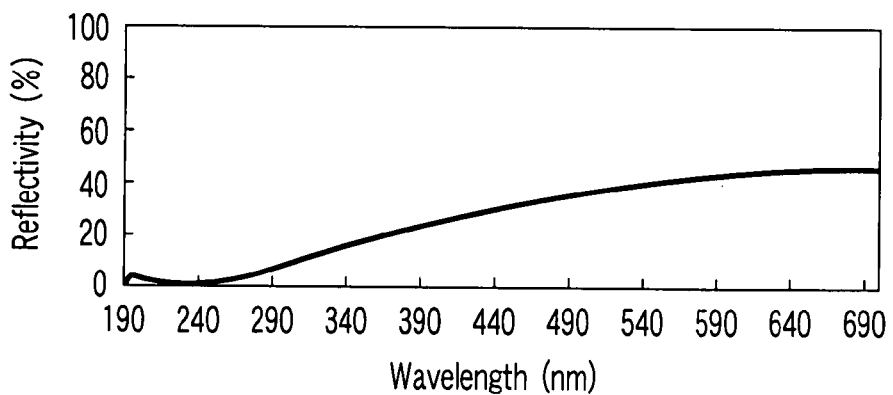
F I G. 15

REFLECTION TYPE PHOTOMASK BLANK, REFLECTION TYPE PHOTOMASK, AND METHOD OF MANUFACTURING SEMICONDUCTOR DEVICE USING THE SAME

CROSS-REFERENCE TO RELATED APPLICATIONS

This is a Continuation Application of PCT Application No. PCT/JP2005/022375, filed Dec. 6, 2005, which was published under PCT Article 21(2) in Japanese.

This application is based upon and claims the benefit of priority from prior Japanese Patent Applications No. 2004-358736, filed Dec. 10, 2004; and No. 2005-273487, filed Sep. 21, 2005, the entire contents of both of which are incorporated herein by reference.

BACKGROUND OF THE INVENTION

1. Field of the Invention

The present invention relates to a method of manufacturing a semiconductor device by photolithographic method using extreme ultraviolet (EUV) light, especially light having wavelength in a soft X-ray region, a reflection type photomask and a reflection type photomask blank used in this method.

2. Description of the Related Art

In the recent trend of high degree of integration in semiconductor elements, there is an increasing demand for miniaturization of necessary pattern transfer on Si substrate by photolithography.

In the conventional method of photolithography using a lamp light source (wavelength of 365 nm) or an excimer laser light source (wavelength of 248 nm or 193 nm), shortening of wavelength of light source is nearing the exposure limit. There is hence an urgent need to establish a new method of photolithography capable of processing as finely as 100 nm or less.

In the development of photolithography, it has been promoted to use $F_2$ laser light (wavelength of 157 nm) which is excimer laser light in a shorter wavelength region. However, since the half size of exposure wavelength is usually the substantial limit of development, the processing limit is about 70 nm.

As disclosed in Jpn. Pat. Appln. KOKAI Publication No. 2001-237174, a new method has been developed, that is, EUV lithography using a light source of EUV light (wavelength of 13 nm) having a wavelength more than one digit shorter than in $F_2$ laser light, specifically 10 to 15 nm.

Refractive index of substances in a wavelength region of EUV light is only slightly smaller than 1. In this method of EUV lithography, since a refractive optical system cannot be used unlike in the conventional exposure light source, a reflective optical system is used for exposure. In the wavelength region of EUV light, almost all substances have a high light absorbing property. Therefore, as a photomask for pattern transfer, a reflection type photomask is used instead of the existing transmission type photomask. Thus, in the method of EUV lithography, the optical system and the photomask used in exposure are evidently different from those used in the conventional exposure technology.

This reflection type photomask for the EUV lithography is composed of a flat Si substrate or a composite quartz substrate, a mirror (reflection mirror) having a high reflectivity in an EUV wavelength region formed thereon, and a light absorption layer of heavy metal having a particularly high absorbing property of EUV light formed further thereon, being patterned according to a desired exposure pattern.

The mirror (reflection mirror) reflecting the EUV light is a multilayer reflection film composed of materials largely different in refractive index. The refraction type photomask transfers the exposure pattern by contrast of EUV exposure reflectivity between the absorption region having the multilayer reflection film surface covered with the light absorption layer, and the reflection region having the multilayer reflection film surface exposed without the light absorption layer.

Usually, the pattern formed on the light absorption layer is inspected by emitting deep ultraviolet (DUV) light having wavelength of about 190 to 260 nm to the mask surface, detecting the reflected light, and measuring the contrast of reflectivity. Specifically, the surface of a buffer layer which is provided immediately beneath the light absorption layer as a protective layer of the multilayer reflection film is used as a reflection region. Then, before processing the pattern of the light absorption layer, based on the contrast of reflectivity with the absorption region of the patterned light absorption layer surface, it is inspected whether the light absorption layer is patterned and formed as desired. In this first step of inspection, it is intended to detect whether the light absorption layer to be removed by etching is left over on the buffer layer (black defect), and whether the light absorption layer to be left over on the buffer layer without being etched is partly removed by etching (white defect).

After correcting the defect detected in the first step of inspection, the buffer layer is removed, and the surface of the multilayer reflection film beneath the buffer layer is exposed, after which the pattern formed in the light absorption layer is finally inspected in the second step. The final inspection is performed by observing the contrast of reflectivity between the absorption region composed of the light absorption layer surface and the reflection region of the multilayer reflection film surface. It may be inspected without removing the buffer layer, but the buffer layer is often removed because the existence of a coated film of the buffer layer on the multilayer reflection film surface tends to lower the reflectivity of the multilayer reflection film.

The inspection of the light absorption layer pattern by DUV inspection light in the first and second steps is intended to observe the contrast of DUV light reflectivity between the buffer layer surface from which the light absorption layer is removed and the light absorption layer surface on which the light absorption layer remains without being removed, and between the multilayer reflection film surface from which the buffer layer is removed and the light absorption layer surface. Therefore, to enhance the precision of inspection, it is desired that the difference in reflectivity is greater in the DUV inspection wavelength region, between the buffer layer surface and the light absorption layer surface in the first step, and between the multilayer reflection film surface and the light absorption layer surface in the second step.

BRIEF SUMMARY OF THE INVENTION

The invention is conceived to improve the EUV lithography, and it is hence an object thereof to provide a reflection type photomask sufficiently low not only in the EUV light exposure reflectivity at the time of transfer of an exposure pattern, but also in DUV light exposure reflectivity at the time of pattern inspection of a light absorption laminated layer, having a light absorption laminated layer capable of obtaining a sufficient reflectivity contrast in a reflection region, and capable of highly accurate inspection and mask pattern transfer.

It is also an object of the invention to provide a reflection type photomask blank obtained by processing a reflection type photomask sufficiently low not only in the EUV light exposure reflectivity at the time of transfer of a mask pattern, but also in DUV light exposure reflectivity at the time of pattern inspection of a light absorption laminated layer, having a light absorption laminated layer capable of obtaining a sufficient reflectivity contrast in a reflection region, and capable of highly accurate inspection and mask pattern transfer.

It is a further object of the invention to provide a method of manufacturing a semiconductor device capable of transferring pattern at high precision by EUV light.

According to an aspect of the invention, there is provided a reflection type photomask blank comprising: a substrate; a multilayer reflection film provided on the substrate; and a light absorption laminated layer including a first light absorption layer provided on the multilayer reflection film and containing tantalum and silicon, and a second light absorption layer laminated on the first light absorption layer and containing at least one of nitrogen and oxygen, and tantalum and silicon.

According to another aspect of the invention, there is provided a reflection type photomask comprising: a reflection type photomask blank which includes: substrate; a multilayer reflection film provided on the substrate; and a light absorption laminated layer including a first light absorption layer provided on the multilayer reflection film and containing tantalum and silicon, and a second light absorption layer laminated on the first light absorption layer and containing at least one of nitrogen and oxygen, and tantalum and silicon; and a pattern processed in a light absorption laminated layer of the reflection type photomask blank.

According to still another aspect of the invention, there is provided a method of manufacturing a semiconductor device comprising: emitting extreme ultraviolet ray to a reflection type photomask comprising: a reflection type photomask blank which includes: substrate; a multilayer reflection film provided on the substrate; and a light absorption laminated layer including a first light absorption layer provided on the multilayer reflection film and containing tantalum and silicon, and a second light absorption layer laminated on the first light absorption layer and containing at least one of nitrogen and oxygen, and tantalum and silicon; and a pattern processed in a light absorption laminated layer of the reflection type photomask blank; exposing a resist layer for extreme ultraviolet ray provided on a semiconductor substrate by a reflected light; and transferring a pattern.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a diagram showing the relation between damping coefficient and sheet resistance related to a TaSi-based material.

FIG. 7 is a diagram showing the relation between damping coefficient and sheet resistance related to a TaSi-based material.

FIG. 10 is a schematic sectional view of a manufacturing process of an example of a reflection type photomask according to a first aspect of the invention.

FIG. 11 is a schematic sectional view of a manufacturing process of an example of a reflection type photomask according to the first aspect of the invention.

FIG. 12 is a schematic sectional view of a manufacturing process of an example of a reflection type photomask according to the first aspect of the invention.

FIG. 13 is a schematic sectional view of a manufacturing process of an example of a reflection type photomask according to the first aspect of the invention.

FIG. 14 is a graph showing spectral reflectivity characteristic of a light absorption laminated layer by changing the thickness of the first light absorption layer and the second light absorption layer.

FIG. 15 is a graph showing spectral reflectivity characteristic of the light absorption laminated layer by changing the thickness of the first light absorption layer and the second light absorption layer.

DETAILED DESCRIPTION OF THE INVENTION

Figure 1:
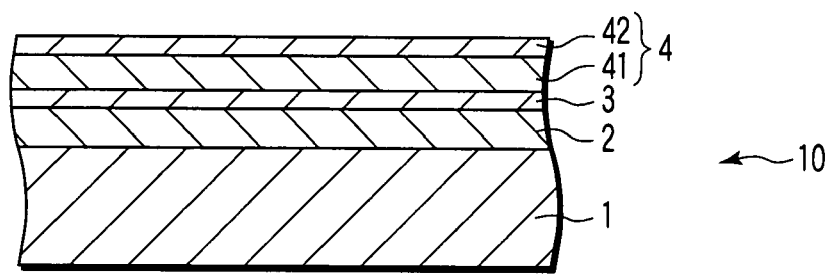
FIG. 1 is a sectional view showing an embodiment of a reflection type photomask blank of the invention.

A reflection type photomask blank of the invention includes a substrate, a multilayer reflection film provided on the substrate, and a light absorption laminated layer provided on the multilayer reflection film, wherein the light absorption laminated layer is formed in a laminated structure consisting of a first light absorption layer containing tantalum and silicon, and a second light absorption layer containing tantalum, silicon and nitrogen and laminated on the first light absorption layer.

A reflection type photomask blank is a product before processing of the reflection type photomask, and its light absorption laminated layer is not patterned according to the exposure pattern to be transferred.

The reflection type photomask of the invention has the same structure as the reflection type photomask blank except that the light absorption laminated layer is patterned.

According to the invention, the light absorption laminated layer used in the reflection type photomask blank and the reflection type photomask is composed of lamination of a first light absorption layer low in reflectivity at least to EUV light exposure, and a second light absorption layer low in reflectivity to EUV light exposure and reflectivity to DUV light exposure. Therefore, an excellent reflectivity contrast is obtained in the reflection region, not only at the time of pattern transfer exposure by EUV light, but also at the time of inspection exposure by DUV light. As a result, the inspection precision of the reflection type photomask and pattern transfer precision are enhanced.

The method of manufacturing a semiconductor device of the invention includes a step of transferring the pattern by emitting an extreme ultraviolet (EUV) light to the reflection type photomask, and exposing the reflected light to a resist layer for EUV light provided on a semiconductor substrate.

In the next developing step, an unnecessary portion of the resist layer is removed, and a pattern of the resist layer is formed on the substrate. Thereafter, a processing object layer is etched by using the pattern of the resist layer as a mask, the pattern of the resist layer is removed, and then a pattern precisely conforming to the photomask pattern is transferred on the substrate. In this manner, a semiconductor device is obtained.

Referring now to the drawings, the invention will be more specifically described below.

Figure 2:
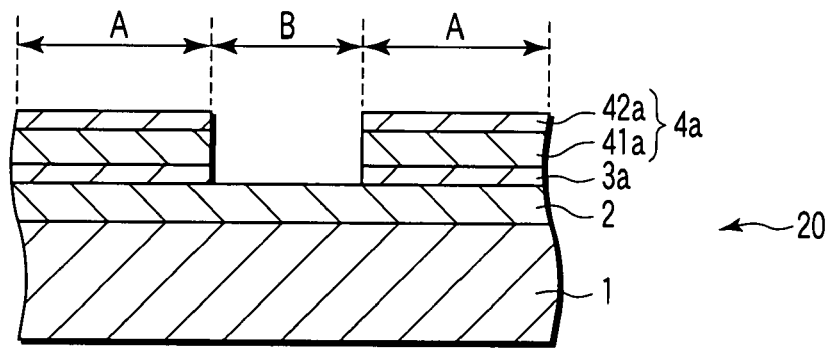
FIG. 2 is a sectional view showing an embodiment of a reflection type photomask.

FIG. 1 is a sectional view of an embodiment of a reflection type photomask blank of the invention, and FIG. 2 is a sectional view of an embodiment of a reflection type photomask.

As shown in FIG. 1, a reflection type photomask blank 10 of the invention includes a multilayer reflection film 2, a buffer layer 3, and a light absorption laminated layer 4 sequentially laminated on a substrate 1. The light absorption laminated layer 4 has a two-layer structure of a first light absorption layer 41 provided on the buffer layer 3, and a second light absorption layer 42 provided thereon. The buffer layer 3 is provided arbitrarily. The multilayer reflection film 2 has a laminated-structure, but is simply shown as a single layer in the drawing.

As shown in FIG. 2, a reflection type photomask 20 of the invention is similar to the structure in FIG. 1, except that a light absorption laminated layer 4a consisting of a patterned first light absorption layer 41a and a patterned second light absorption layer 42a is provided instead of the light absorption layer 4 consisting of the first light absorption layer 41 and the second light absorption layer 42, and that a patterned buffer layer 3a is provided instead of the buffer layer 3. In the reflection type photomask 20, by this pattern processing, the light absorption laminated layer 4 is partly removed, and the partly exposed portion of the surface of the multilayer reflection film 2 forms a reflection region B, while the remaining surface of the light absorption laminated layer 4 forms an absorption region A. At this time, the multilayer reflection film 2 can be protected by interposing a capping layer (not shown) between the buffer layer 3 and the multilayer reflection film 2. The material of the capping layer includes, for example, Ru, Zr, Si, Nb, and nitrides and oxides thereof.

The first light absorption layer in the lower layer of the light absorption laminated layer contains Ta and Si.

Ta is a material having a high absorbing property for light in a short wavelength region such as EUV light. However, a single film of Ta tends to form a crystalline film such as α-Ta or β-Ta. In such a crystalline state, the surface becomes rough due to effects of Ta crystal particles, and it is hard to obtain a light absorption laminated layer surface of high smoothness. Further, due to effects of the Ta crystal particles, it is hard to obtain excellent etching anisotropy of light absorption laminated layer with respect to dry etching, the pattern edge becomes rough, and the patterning precision tends to decline. To assure smoothness on the light absorption laminated layer surface, and to form a pattern by anisotropic processing by using dry etching on the light absorption laminated layer, it is desired that the crystalline state of the light absorption laminated layer be amorphous.

By adding a proper amount of Si to Ta, the obtained alloy tends to be amorphous easily.

Figure 3:
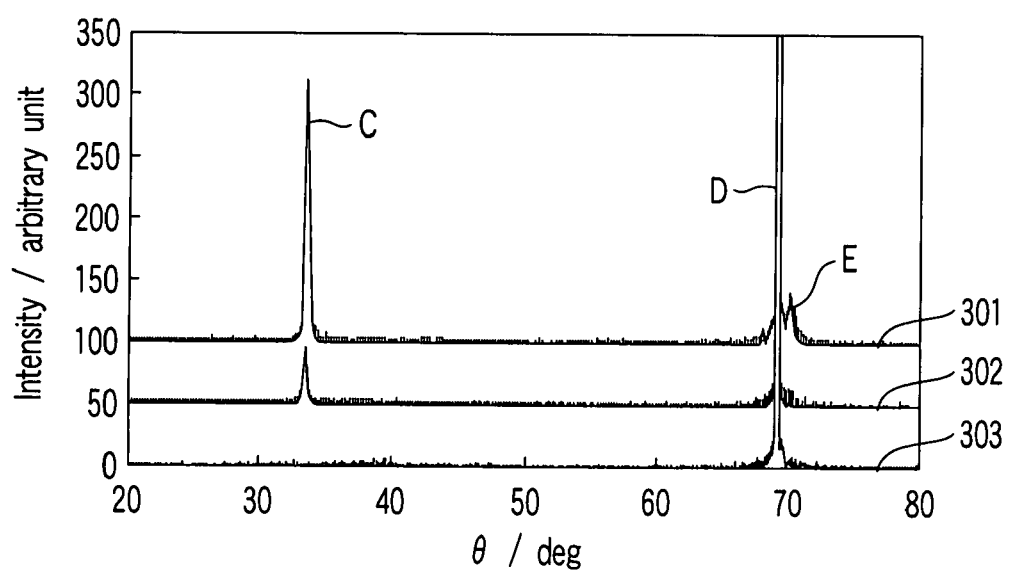
FIG. 3 is a graph showing an example of X-ray diffraction data of an alloy film composed of Ta and Si.

FIG. 3 is a graph showing an example of X-ray diffraction data of an alloy film of Ta and Si.

In the graph, reference numeral 301 shows the result of measurement of X-ray diffraction when Ta is 100 at %, 302 shows the result of measurement of X-ray diffraction when Ta is 96.4 at % and Si is 3.6 at %, and 303 shows the result of measurement of X-ray diffraction when Ta is 94.1 at % and Si is 5.9 at %. Peak C represents the presence of a β-Ta (002) plane, peak D represents the presence of a Si (400) plane, and peak E represents the presence of a β-Ta (004) plane.

As understood from these graphs, by adding Si to Ta, the crystallinity of a Ta layer is lost, and the layer tends to be amorphous in an alloy state at Si content of about 5.9 at %. Hence, the first light absorption layer preferably has Si content of at least 6 at % in the light absorption film. Estimating the first light absorption layer to be 1000 Å from the viewpoint of fine processing, the content of Si in the light absorption film is preferred to be 15 at % or less. More preferably, the first light absorption layer preferably has Si content of 6 at % to 15 at %, and Ta content of 85 at % to 94 at %. When the Si content in the light absorption film is in the above range, the crystalline state of the first light absorption layer tends to be amorphous. If out of this range, it tends to be crystalline. When the Ta content in the light absorption film is in the above range, the crystalline state of the first light absorption layer tends to be amorphous. If out of this range, it tends to be crystalline. When Ge or the like is added to Ta, an amorphous light absorption film is obtained due to similar effects.

However, when the light absorption laminated layer is formed of a single layer of an alloy of Ta and Si, the reflectivity of the light absorption laminated layer surface on light of a short wavelength region of EUV is lowered. However, on the DUV (deep ultraviolet) light for inspection more than one digit longer in wavelength than EUV light, the reflectivity of the light absorption laminated layer surface tends to be relatively higher. For inspection of a reflection type photomask for EUV light exposure, it is intended to measure the contrast of reflected light obtained by emitting light of a DUV light wavelength region of about 190 to 260 nm in wavelength to the mask. Accordingly, the light absorption laminated layer is demanded to be lower in EUV light exposure reflectivity than in a buffer layer surface or a multilayer reflection film surface. When the reflectivity of DUV light for inspection on the light absorption laminated layer surface is lower than on the buffer layer surface or the multilayer reflection film surface, and the difference therebetween is greater, a high contrast of reflected light by DUV light for inspection is obtained, and an accurate inspection is possible.

The inspection wavelength contrast is preferred to be more than 50%.

Contrast value r (%) is expressed as follows:

$$r=\{|Rm-Ra|/(Rm+Ra)\}\times 100\%$$

where Rm is reflectivity on a multilayer reflection film surface or a buffer layer surface, and Ra is reflectivity on a light absorption laminated layer surface. The pattern formed on the light absorption laminated layer is inspected by detecting the reflectivity contrast of the light absorption laminated layer surface on the buffer layer surface and the multilayer reflection film surface. Herein, the reflectivity of the buffer layer surface is often smaller than that of the multilayer reflection film surface. Hence, in the light absorption laminated layer, it seems to be slightly more difficult to obtain a contrast to the buffer layer surface, than the case of assuring contrast, that is, difference in reflectivity to the multilayer reflection film surface.

Materials for a buffer layer include $SiO_2$, Ru, ITO, Cr, $Cr_xN_{1-x}$, $Cr_xO_{1-x}$, C, $B_4C$, and the like. In the case of $SiO_2$ or Ru, the reflectivity in DUV light wavelength region is required to be about 40 to 50% though variable depending on the film thickness. Therefore, from the above formula expressing the contrast, a range of reflectivity to DUV light necessary for the light absorption laminated layer to obtain a contrast of more than 50% can be determined, and the reflectivity of the light absorption laminated layer to DUV light is desired to be smaller than 13%.

According to a first aspect of the invention, in order to lower the DUV light exposure reflectivity of the light absorption laminated layer, a second-light absorption layer different in composition from a first light absorption layer and containing Ta, Si and N is laminated on the first light absorption layer. The second light absorption layer is formed of a metal nitride, its DUV light exposure reflectivity can be lowered as compared with the case of a metal film alone. At the same time, by nitriding of metal, the film is advanced in crystalline or amorphous state than in metal alone, and thus the surface smoothness is enhanced. The second light absorption layer is preferably formed in the uppermost surface of the light absorption laminated layer. When a metal oxide is used as the second light absorption layer, similar effects are obtained in lowering the DUV light exposure reflectivity, but in this case charge-up tends to occur due to decline of conductivity.

According to the first aspect of the invention, the second light absorption layer preferably contains Si by 40 to 60 at %. More preferably, the second light absorption layer contains Si by 40 to 60 at %, and Ta by 2 to 7 at %. Further preferably, the second light absorption layer contains Si by 40 to 60 at %, Ta by 2 to 7 at %, and N by 6 to 15 at %.

In the first aspect of the invention, if the Si content in the second light absorption layer is smaller than 40 at %, the DUV light permeability in the second light absorption layer tends to be smaller. Accordingly, the action of interference tends to decline between reflected light (1) on the first light absorption layer of the light absorption laminated layer, and reflected light (2) on the second light absorption layer. The action of interference depends on the mutually canceling effect of lights of two routes of the reflected light (1) and the reflected light (2). The greater this effect, the lower is the final reflectivity on the surface of the light absorption laminated layer 4. When the Si content is larger than 60 at %, the DUV light permeability in the first light absorption layer tends to be higher and the reflected light (2) is likely to be larger. Thus, the effect of low reflection is likely to be lost. By increase of Si content, the conductivity is lowered, the charging amount is elevated, and the charging effect, for example, occurrence of defective pattern in pattern drawing by using electron ray cannot be ignored.

In the first aspect of the invention, if the Ta content in the second light absorption layer is smaller than 2 at %, the absorption of EUV light is lowered, and thus a greater film thickness may be required for obtaining a specified light absorption. If the Ta content in the second light absorption layer is larger than 7 at %, the light absorption is increased and the DUV light permeability drops, and thus the effect of low reflection in the second light absorption layer tends to be lost by the action of interference.

Further, in the first aspect of the invention, if the N content in the second light absorption layer is smaller than 6 at %, the light permeability declines, and the effect of low reflection in the second light absorption layer may be lost by the action of interference. If the N content in the second light absorption layer is larger than 15 at %, the EUV light absorption declines. As a result, a greater film thickness tends to be demanded for obtaining specified light absorption, and the surface roughness tends to be increased.

According to the first aspect of the invention, if the second light absorption layer contains Ta, Si and N within each specified range, the surface reflectivity and smoothness are improved at the same time. Thus, in the invention, by forming the light absorption laminated layer in a laminated structure, it is possible to suppress the reflectivity at exposure wavelength in the light absorption laminated layer, and the reflectivity at inspection wavelength in the light absorption laminated layer surface to be low.

The material having light absorbing property of DUV light includes Si nitride not containing Ta. In such a case, however, there is an disadvantage that since the absorption of EUV light is lowered, the thickness of the first light absorption layer must be increased. In the invention, the structure contains Ta, that is, a material of high absorption of EUV light, not only in the first light absorption layer in the lower layer of the light absorption laminated layer, but also in the second light absorption layer in the upper layer, and hence the entire light absorption laminated layer cab be reduced in film thickness.

In the light absorption laminated layer of the invention, the surface roughness is preferred to be 1 nm Rms or less, or more preferably 0.6 nm Rms or less. When the surface roughness is 1 nm Rms or less, in patterning by dry etching of the light absorption laminated layer, it is easy to obtain linearity at the pattern end portion after processing. However, if the surface roughness exceeds 1 nm Rms, the surface end portion of the light absorption laminated layer tends to be rough, and the pattern precision tends to be lowered.

According to the invention, the light absorption laminated layer is composed of the first light absorption layer and the second light absorption layer laminated in this order on the multilayer reflection film. However, when the first light absorption layer and the second light absorption layer are laminated reversely, the reflectivity is determined by the surface of the first light absorption layer, the action of interference declines, and it tends to be hard to obtain the effect of low reflection.

The multilayer reflection film is obtained by repeating lamination of Mo layer and Si layer, or Mo layer and Be layer, by about 30 to 40 cycles. Each layer is formed in a thickness of, for example, 2.8 nm to 4.2 nm.

According to the method of manufacturing a semiconductor device of the invention, in the EUV lithography, pattern transfer of high precision is possible, and a semiconductor device having fine patterns can be manufactured. That is, EUV light emitted from the EUV light source is concentrated by a focusing mirror and reflected, and emitted to the reflection type photomask of the invention, and the EUV light formed in pattern by the reflection type photomask is reduced, projected and exposed on the wafer surface coated with EUV light resist by way of a reflection and projection optical system. Subsequently, a desired resist pattern is formed by developing, and using this resist pattern as a mask, the wafer surface is etched to manufacture a semiconductor device having fine patterns.

According to a second aspect of the invention, in order to lower the DUV light exposure reflectivity of the light absorption laminated layer, a second light absorption layer different in composition from a first light absorption layer and containing Ta, Si and O is laminated on the first light absorption layer. The second light absorption layer may also contain Ta, Si, O and N. By forming the second light absorption layer from a metal oxide, the DUV light exposure reflectivity can be further lowered than in the case of a metal film alone. By forming the second light absorption layer from a metal oxide layer or a metal oxynitride layer, as compared with a layer of a metal film alone, the crystalline or amorphous state is promoted. Accordingly, the smoothness of the light absorption layer surface is improved. The second light absorption layer is preferred to be formed on the uppermost surface of the light absorption laminated layer.

However, when the uppermost layer of the light absorption laminated layer is formed as a reactive film of oxide or oxynitride, charge-up accompanied by decline of conductivity may occur depending on the reactivity or degree of Si ratio in the second light absorption layer.

Hence, in the second aspect of the invention, the second light absorption layer used contains Ta, Si, and O, its damping coefficient is smaller than 1, and its sheet resistance is 50 MΩ/□ or less.

In the second light absorption layer of the first aspect of the invention as well, the damping coefficient is preferred to be smaller than 1 and the sheet resistance is preferred to be 50 MΩ/□ or less.

Since the sheet resistance of the second light absorption layer is 50 MΩ/□ or less, charge-up of the uppermost layer of the light absorption laminated layer can be prevented, and thus defective pattern by charging hardly occurs at the time of electron beam drawing of the light absorption laminated layer.

By using Ta, light absorption of EUV light is obtained, and its film thickness can be reduced. Since the damping coefficient is smaller than 1, it is possible to assure transparency for obtaining the action of interference of reflected light in the second light absorption layer. If the damping coefficient is larger than 1, transparency in the second light absorption layer is not enough. As a result, the action of interference declines between the reflected light of the second light absorption layer and the reflected light of the first light absorption layer, and a sufficient action of low reflection is not obtained.

Thus, according to the second aspect of the invention, the smoothness of the surface of the second light absorption layer is assured, the pattern edge is sharp because the crystal state of the material to be formed is amorphous when forming patterns on the first and second light absorption layers by anisotropic dry etching, and charge-up in the second-light absorption layer is prevented, so that the pattern precision of the light absorption laminated layer is excellent.

In the second aspect of the invention, when the Ta ratio of the second light absorption layer is relatively small, for example, when the Ta content is about 40 at % or less of the second light absorption layer, the damping coefficient and sheet resistance of a desired range can be obtained by using an oxide film substantially composed of Ta, Si and O, or an oxynitride film substantially composed of Ta, Si, O and N, as the second light absorption layer.

Figure 4:
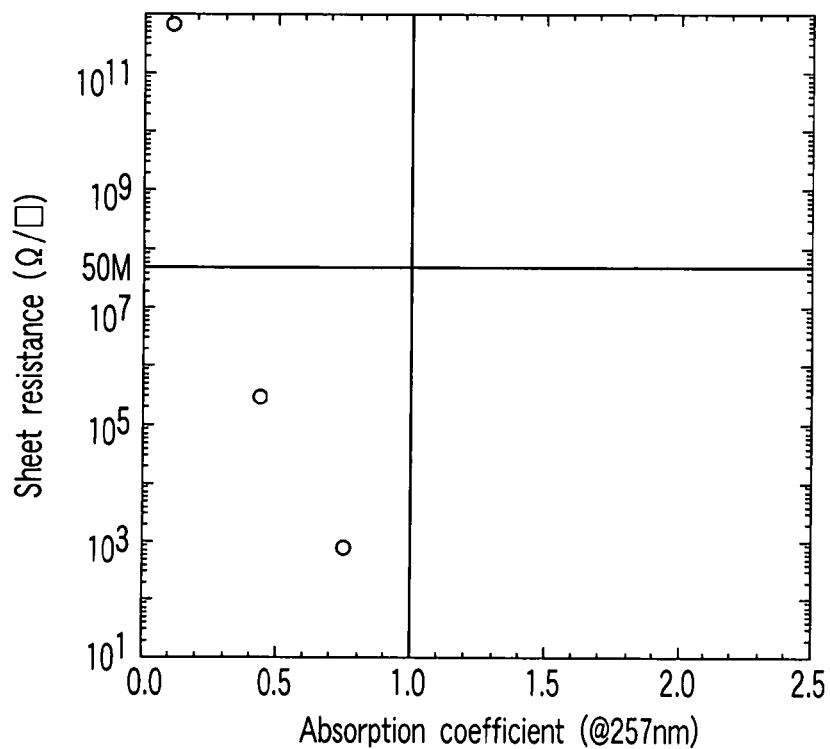
FIG. 4 is a diagram showing the relation between damping coefficient and sheet resistance related to a TaSi-based material.
Figure 5:
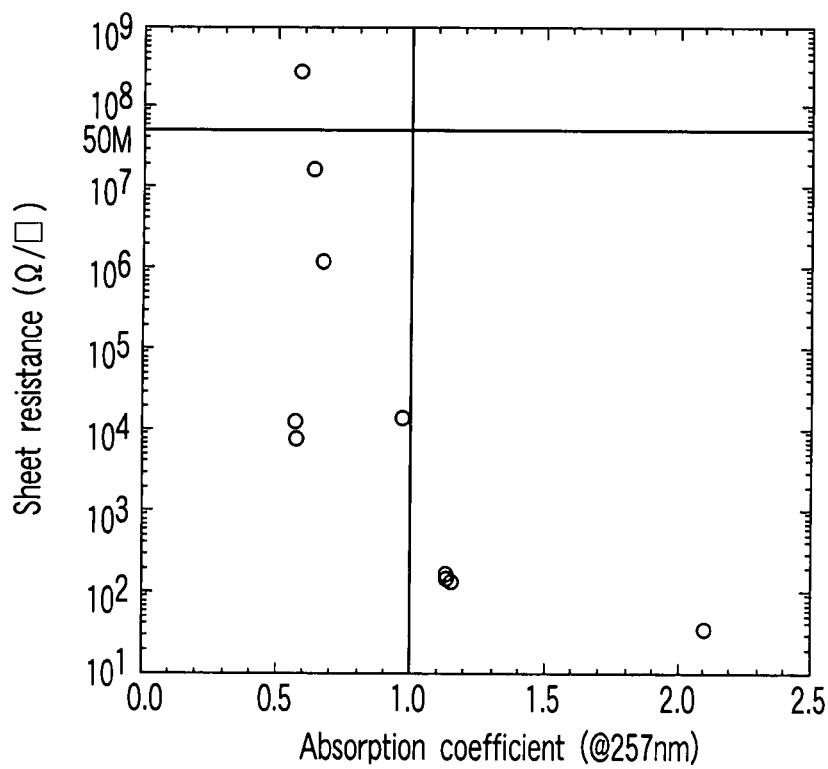
FIG. 5 is a diagram showing the relation between damping coefficient and sheet resistance related to a TaSi-based material.

FIGS. 4 and 5 show the relation between damping coefficient and sheet resistance of a TaSi-based material relatively small in Ta content.

FIG. 4 shows the characteristic of an oxide film (TaSiO film), and FIG. 5 shows the characteristic of an oxynitride film (TaSiON film).

The sample used is manufactured by forming TaSi of 75 nm in thickness as a first light absorption layer on a synthetic quartz substrate of 0.525 nm in thickness, and then forming an oxide film (TaSiO film) or an oxynitride film (TaSiON film) of 27 nm in thickness as a second light absorption layer.

The oxide film and the oxynitride film of the sample are formed by the sputtering method.

For sputtering of each light absorption layer, first, when forming a first light absorption layer, two elements are used, that is, a TaSi alloy target and a Ta target, and when forming a second light absorption layer, DC power to be applied to targets is adjusted by using T and Si targets. Sputtering gas atmosphere is Ar in the first light absorption layer, and Ar and $O_2$ in the case of TaSiO, or Ar, $_{O2}$ and $N_2$ in the case of TaSiON in the second light absorption layer.

As shown in FIGS. 4 and 5, films having damping coefficient smaller than 1 and sheet resistance smaller than 50 MΩ/□ are obtained in both compositions of TaSiO and TaSiON.

Of the films shown in FIGS. 4 and 5, concerning the damping coefficient and sheet resistance, as a result of analysis of composition of a film satisfying the desired range of the damping coefficient and sheet resistance, a desired range is found to be Ta of 30 to 40 at %, and composition ratio of Ta and O (Ta:O) of 1:1 to 1:2 in the case of TaSiO. In the case of TaSiON, a desired range is found to be Ta of 20 to 40 at %, composition ratio of Ta and O (Ta:O) of 3:2 to 9:1, and composition ratio of Ta and N (Ta:N) of 1:2 to 3:2. Preferably, Ta is 30 to 40 at %. This is because when the Ta ratio is higher, a high absorption characteristic is obtained, and the film thickness can be reduced, which is advantageous for fine processing.

According to the second aspect, when the Ta ratio of the second light absorption layer is relatively small, for example, when the Ta ratio is about 40 at % or less of the second light absorption layer, the damping coefficient and sheet resistance of a desired range can be obtained by using an oxide film substantially composed of Ta, Si and O as the second light absorption layer.

FIGS. 6 and 7 show the relation between damping coefficient and sheet resistance of a TaSi-based material relatively large in Ta content.

FIG. 6 shows the characteristic of an oxide film (TaSiO film), and FIG. 7 shows the characteristic of an oxynitride film (TaSiON film).

For sputtering of a light absorption layer of each sample, DC power to be applied to each target is adjusted so that the Ta content may be higher by using $TaSi_4$ and Ta targets. For example, 50 W is applied to the $TaSi_4$ target, and 250 W to the Ta target. The gas atmosphere is Ar when forming a first light absorption layer, the gas atmosphere in sputtering is $Ar/O_2$ when forming a TiSiO film, and the gas atmosphere is $Ar/O_2/N_2$ when forming a TaSiON film.

As shown in FIGS. 6 and 7, when the Ta content is high, in the case of TaSiO as shown in FIG. 6, the film can be formed in a scope satisfying the desired range of the damping coefficient and sheet resistance. In the case of TaSiON as shown in FIG. 7, however, it is hard to obtain a film in a scope satisfying the desired range of the damping coefficient and sheet resistance. This is because, in the film mainly composed of nitride, due to effects of TaN large in the damping coefficient as a result of increase of Ta ratio in the film, it is hard to assure transparency by oxygen.

Hence, as can be seen in FIG. 7, when the film is mainly composed of nitride, drop of the damping coefficient is small even if the flow rate of oxygen gas in the atmosphere is raised, and increase of sheet resistance is a problem. As a result, it is found hard to obtain a film in a scope satisfying the desired range of the damping coefficient and sheet resistance.

Of the films shown in FIGS. 6 and 7, concerning the damping coefficient and sheet resistance, as a result of analysis of composition of a film satisfying the desired range of the damping coefficient and sheet resistance, a desired range is found to be Ta of 40 to 90 at %, and composition ratio of Ta and O (Ta:O) of 3:5 to 5:1. In this sample, the first light absorption layer and the second light absorption layer can be formed by using the same target only by changing the gas atmosphere, so that the film forming process may be simplified.

Figure 8:
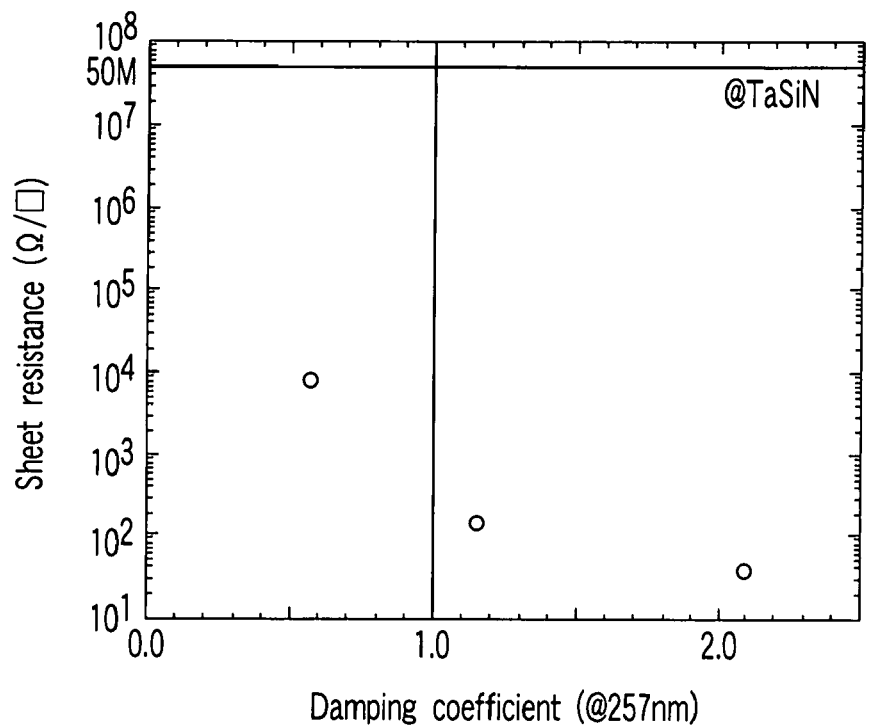
FIG. 8 is a diagram showing the relation between damping coefficient and sheet resistance related to a TaSi-based material.

In TaSiN as well, the relation between the damping coefficient and sheet resistance is investigated, and the result as shown in FIG. 8 is obtained.

Ar and $N_2$ gas are used as a sputtering atmosphere in the sample using Ta and Si targets, so that the sample contains tantalum by 2 to 7 at %, silicon by 40 to 60 at %, and nitrogen by 6 to 15 at %.

As shown in the drawing, TaSiN is low in sheet resistance on the whole, being 50 M$\Omega$/□ or less. Although it is hard to charge, the damping coefficient for obtaining the second light absorption layer is likely to be larger than 1. However, both sheet resistance and damping coefficient can be set lower than desired values.

As known from FIGS. 4 to 8, TaSiO is effective for lowering the damping coefficient of the second light absorption layer and assuring transparency, but it is found that the sheet resistance tends to be higher. On the other hand, TaSiN is lightly inferior in lowering the damping coefficient of the second light absorption layer, but is sufficiently low in sheet resistance, and TaSiON is found to show an intermediate characteristic both in damping coefficient and sheet resistance.

The TaSi film is larger in damping coefficient than the TaSiN film, TaSiO film, and TaSiON film.

In the second aspect of the invention, whether the second light absorption layer is formed as a film of small Ta content or a film of large Ta content, or formed as an oxide film or as an oxynitride film, may be properly selected depending on the dry etching characteristic of the light absorption laminated-layer.

For example, when the uppermost layer is the second light absorption layer, and the second light absorption layer is formed as an oxide film (TiSO film) small in Ta content, after patterning the second light absorption layer by fluorine gas, the first light absorption layer (TaSi film) can be etched by using chlorine gas.

In this case, since the resist etching rate by fluorine gas is generally large, the etching amount of resist by TaSiO etching of the second light absorption layer of smaller Ta content is increased. However, in etching of the first light absorption layer (TaSi film), the atmosphere gas is replaced by nitrogen gas, and the first light absorption layer (TaSi film) can be etched by using the second light absorption layer (TaSiO film) as a mask.

Further, assuming the uppermost layer to be the second light absorption layer, when the second light absorption layer is composed of an oxynitride film (TaSiON film) of small Ta content, an oxide film (TaSiO film) of large Ta content, or oxynitride film (TaSiON film) of large Ta content, both the first and second light absorption layers can be dry-etched by chlorine gas. Generally, by using chlorine gas, the etching amount of resist is smaller than when fluorine gas is used. Hence a sufficient resistance to etching is assured.

As mentioned above, the reflectivity of the light absorption laminated layer on DUV light is preferred to be smaller. In the case of the second light absorption layer made of TaSiO, in the condition that the reflectivity Ra at inspection wavelength of 257 nm is 10% or less, the relation between the first light absorption layer and the second light absorption layer is investigated.

The second light absorption layer is preferred to be as small as possible in damping coefficient, as long as the sheet resistance is smaller than in a specified range, for example, 50 M$\Omega$/□. To determine this relation, in a range of the sheet resistance smaller than 50 M$\Omega$/□, the damping coefficient for minimizing the second light absorption layer is determined from FIGS. 4 and 6, and 0.4 is obtained. The first light absorption layer, for example, the TaSi film is a metal film, and as long as the film thickness is 500 Å or more, effect of the film on DUV light reflectivity is small. Thus, to determine the relation, the film thickness of the first light absorption layer is assumed to be 750 Å and the refractive index to be a representative value of 1.8. In FIGS. 4 and 6, the refractive index of the second light absorption layer in a preferred range is a numerical value of about 2.0, and the refractive index of the second light absorption layer is supposed to be a representative value of 2.0.

Figure 9:
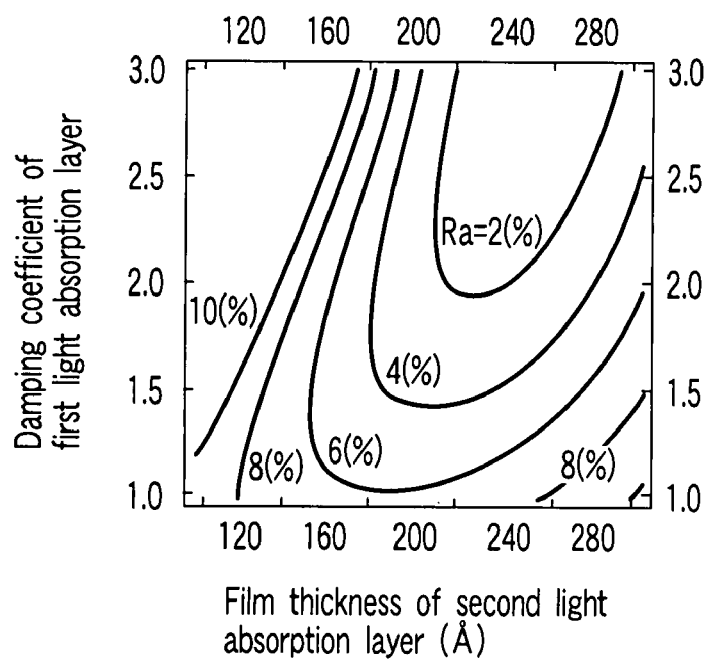
FIG. 9 is a graph showing the relation between damping coefficient of a first light absorption layer and film thickness of a second light absorption layer.

In such condition, at reflectivity Ra of 2, 4, 6, 8, and 10% at inspection wavelength of 257 nm, the relation between damping coefficient of the first light absorption layer and film thickness of the second light absorption layer is shown in a graph in FIG. 9.

As shown in the graph, the relation between damping coefficient of the first light absorption layer and film thickness of the second light absorption layer is expressed in a contour line graph. Thus, by using such items of high degree of freedom in design, that is, using the damping coefficient of the first light absorption layer and film thickness of the second light absorption layer as parameters, and predetermining other numerical values as described above, it is possible to select a combination of appropriate parameters so that the reflectivity Ra at inspection wavelength may be 10% or less. Therefore, by determining the numerical values of the first light absorption layer which are easier to set, the film thickness of the second light absorption layer can be determined. Herein, the inspection wavelength is assumed to be 257 nm, but the same can be determined at other inspection wavelength. It is the same in TaSiN or TaSiON of the second light absorption layer shown in other examples of the invention.

Specifically, the TaSiO film is an abbreviated expression of, for example, a $Ta_aSi_bO_{1-a-b}$ film, the TaSiON film is an abbreviated expression of, for example, a $Ta_cSi_dO_eN_{1-c-d-e}$ film, and the TaSiN film is an abbreviated expression of, for example, a $Ta_fSi_gN_{1-f-g}$ film, where a, b, c, d, e, f, and g are positive numbers of less than 1, defined in the relation of 1>a+b, 1>c+d+e, and 1>f+g.

The invention will be more specifically described below by showing examples below.

EXAMPLE 1

FIGS. 10 to 13 are schematic sectional views showing the manufacturing process of an example of a reflection type photomask in a first aspect of the invention.

On a substrate 1, a multilayer reflection film 2, a buffer layer 3, a first light absorption layer 41, and a second light absorption layer 42 were sequentially formed as follows, and a reflection type photomask blank 10 of the invention having the same configuration as shown in FIG. 1 was fabricated.

The substrate 1 was a synthetic quartz substrate of 6-inch square and 0.25-inch thickness with a polished flat surface.

On the substrate 1, the multilayer reflection film 2 was manufactured by DC magnetron sputtering, by laminating Mo and Si alternately in about 40 cycles, so that the reflectivity may be maximum in EUV light in a region of wavelength of 13 to 14 nm. This multilayer reflection film 2 is composed of multiple layers, but is simply shown as a single layer in the drawing.

The film thickness of one cycle of Mo and Si was 7 nm, specifically consisting of 2.8 nm of Mo and 4.2 nm of Si, and Si of 7 nm was formed finally so that the uppermost layer of the multilayer reflection film 2 may be Si.

Next, on this multilayer reflection film 2, a buffer layer 3 of Ru was formed in a film thickness of 40 nm.

Then, the substrate 1 on which the multilayer reflection film 2 and the buffer layer 3 were formed was installed in a DC magnetron sputtering apparatus. In the DC magnetron sputtering apparatus, a TaSi alloy target of Ta and Si ratio of 1:4 and a Ta target were applied, and by two-element sputtering in an Ar gas atmosphere by applying DC power of 50 W and 250 W to the TaSi alloy target and the Ta target, respectively, a first light absorption layer. 41 was formed in a film thickness of 75 nm on the buffer layer 3 at gas pressure of 0.25 Pa. At this time, the surface roughness of the first light absorption layer 41 after forming was 0.14 nm Rms, and an excellent surface smoothness was confirmed.

After forming the light absorption layer 41, using the TaSi alloy target of Ta and Si ratio of 1:4 and the Ta target, by two-element sputtering in a mixed gas atmosphere of Ar and $N_2$ at 1:1 by applying DC power of 50 W and 250 W to the TaSi alloy target and the Ta target, respectively, a second light absorption layer 42 was formed on the first light absorption layer 41 in a film thickness of 15 nm in a composition mainly composed of Ta, Si, and N at gas pressure of 0.25 Pa. At this time, the surface roughness of the second light absorption layer 42 after forming was 0.42 nm Rms, and an excellent surface smoothness was confirmed.

In this manner, the second light absorption layer 42 was laminated on the first light absorption layer 41, and the spectral reflectivity was measured on the uppermost layer of the obtained light absorption laminated layer 4.

As a result, the spectral reflectivity was 4.25% at wavelength of 193 nm, and 9.83% at 257 nm, and a sufficient low reflectivity characteristic in a DUV light wavelength region for inspection was obtained.

On the second light absorption layer 42, a positive type electron ray resist (FEP-171, manufactured by Fuji Film Arch) was applied, and a resist layer was formed as shown in FIG. 10.

By subsequent lithography process of EB drawing and developing, patterning process was performed to form a resist pattern 5a as shown in FIG. 11.

Using the resist pattern 5a as a mask, by dry etching in the sequence of the second light absorption layer 42 and the first light absorption layer 41, a pattern of a light absorption laminated layer 4a as shown in FIG. 12 was formed. Dry etching was executed by using a dry etching apparatus of an ICP discharge system, in a mixed gas atmosphere of $Cl_2$ gas at 40 sccm and He gas at 65 sccm at gas pressure of 5 mTorr, with bias power of 40 W and source power of 200 W. The resist was later removed by $O_2$ ashing and wetting process. After continuous dry etching of the second light absorption layer 42 and the first light absorption layer 41, the selection ratio to the resist of the final light absorption laminated layer 4 was about 0.85.

Herein, the light absorption laminated layer 4 was partly removed, and the inspection wavelength reflectivity of 257 nm in the surface of the buffer layer 3 in the exposed region was 52.4%. On the other hand, the reflectivity at 257 nm on the surface of the light absorption laminated layer 4a in the absorption region was 10.5%. As a result, an excellent contrast of 66% was obtained between the surface reflected light of the buffer layer 3 and the surface reflected light of the light absorption laminated layer 4.

Successively, as shown in FIG. 13, patterns of the buffer layer 3a and the light absorption laminated layer 4a having excellent lateral wall anisotropy were obtained in the same procedure as in the dry etching of the light absorption laminated layer 4, except that the dry etching of a Ru buffer layer 3 immediately beneath the light absorption laminated layer 4 was conducted in a mixed gas atmosphere of $Cl_2$ gas at 40 sccm and $O_2$ gas at 25 sccm, instead of a mixed gas atmosphere of $Cl_2$ gas at 40 sccm and He gas at 65 sccm, and that the second light absorption layer 42 was used as the mask.

In this manner, a reflection type photomask 20 of the invention having the same configuration as shown in FIG. 2 was obtained.

Herein, the buffer layer 3 and the light absorption laminated layer 4 were partly removed, and the inspection wavelength reflectivity of 257 nm in the surface of the multilayer reflection film in the exposed reflection region B was 60%. On the other hand, the reflectivity at 257 nm on the surface of the light absorption laminated layer 4a in the absorption region A was 9.2%, which is slightly lower than in the state of the reflection type photomask blank 10. This is considered to be because the surface of the light absorption laminated layer 4a was slightly roughened as a result of resist application, peeling, and etching of the first light absorption layer by using the second light absorption layer as a mask.

As a result, an excellent contrast of 73% was obtained between the surface reflected light of the multilayer reflection film 2 and the surface reflected light of the light absorption laminated layer 4.

EXAMPLE 2

Another example of the reflection type photomask blank according to the first aspect was fabricated in the same manner as in example 1, except that the sputtering film forming time was set to be longer than in example 1 for forming a second light absorption layer having film thickness of 20 nm.

On the uppermost surface of a light absorption laminated layer 4 of the obtained reflection type photomask blank, the spectral reflectivity was measured in the same manner as in example 1.

As a result, it was 8.85% at wavelength of 193 nm, and 1.93% at 257 nm, and in this case a sufficient low reflectivity characteristic was obtained in a DUV light wavelength region for inspection at 257 nm, in particular.

Using this reflection type photomask blank, a reflection type photomask was manufactured in the same manner as in example 1, and inspection wavelength reflectivity at 257 was measured after dry etching in $Cl_2$ and He mixed gas atmosphere, and dry etching in $Cl_2$ and $O_2$ mixed gas atmosphere.

On the buffer layer surface in an exposed region where the light absorption laminated layer is partly removed, the inspection wavelength reflectivity at 257 nm was 52.0%. On the other hand, on the surface of the light absorption laminated layer in an absorption region, the reflectivity at 257 nm was 2.1%. As a result, an excellent contrast of 92% was obtained between the surface reflected light of the buffer layer and the surface reflected light of the light absorption laminated layer.

On the multilayer reflection film surface in the reflection region and on the light absorption laminated layer surface in the absorption region, the inspection wavelength reflectivity at 257 nm was 60% and 1.5%, respectively. As a result, an excellent contrast of 95% was obtained between the surface reflected light of the multilayer reflection film and the surface reflected light of the light absorption laminated layer.

FIG. 14 is a graph showing the spectral reflectivity characteristic of the light absorption laminated layer when the thickness is changed in the first light absorption layer and the second light absorption layer in example 1 and example 2.

In the graph, curve 401 is a graph of spectral reflectivity characteristic of the light absorption laminated layer in example 1 laminated with 750 angstroms of the first light absorption layer and 150 angstroms of the second light absorption layer, and curve 402 is a graph of spectral reflectivity characteristic of the light absorption laminated layer in example 2 laminated with 750 angstroms of the first light absorption layer and 200 angstroms of the second light absorption layer.

As shown in the diagram, the light absorption in a wavelength region of about 190 nm to about 230 nm is high in the curve 401, and the light absorption in a wavelength region of about 230 nm to about 260 nm is high in the curve 402. Inspection light of the reflection type photomask is light in a wavelength region of 190 to 260 nm out of the deep ultraviolet ray wavelength region, for example, light in a wavelength region of 193 nm or 257 nm. Hence, as shown in FIG. 14, if the first light absorption layer is 750 angstroms, a preferred thickness of the second light absorption layer is known to be 150 to 200 angstroms.

EXAMPLE 3

In the same manner as in example 1, a multilayer reflection film and a first light absorption layer were formed on a substrate.

Then, using a Ta target and a Si target, in a mixed gas atmosphere of $Ar/O_2$ =36/4 (sccm), DC power of 60 W and 240 W was applied to the Ta target and the Si target, respectively, at gas pressure of 0.25 Pa, and a TaSi oxide film having a thickness of 27 nm was formed by two-element sputtering. At this time, the surface roughness of the upper layer absorption layer after forming of the film was 0.42 nm Rms, and a favorable surface smoothness was confirmed. The composition of the formed TaSi oxide film was 33 at % of Ta and 36 at % of $O_2$. Spectral reflectivity on the outermost layer of the obtained light absorption laminated layer was measured, and results are shown in FIG. 15. It was 2.55% at wavelength of 193 nm, and 1.51% at 257 nm, and a sufficient low reflectivity characteristic in a DUV light wavelength region for inspection was obtained.

On the second light absorption layer, in the same manner as in example 1, a positive type electron ray resist (FEP-171, manufactured by Fuji Film Arch) was applied, and a resist layer was formed, a resist pattern was formed by subsequent lithography process of EB drawing and developing.

Using the resist pattern as a mask, the second light absorption layer was etched by using a dry etching apparatus of an ICP discharge system, in a mixed gas atmosphere of $C_2F_6/O_2/He$=5/5/15 (sccm) at gas pressure of 665 mTorr, with bias power of 20 W and source power of 100 W. The first light absorption layer was etched in the same apparatus, in a mixed gas atmosphere of $Cl_2/He$=40/60 (sccm) at gas pressure of 665 mTorr, with bias power of 40 W and source power of 200 W. The resist was then removed in the same manner as in example 1.

Herein, the light absorption laminated layer 4 was partly removed, and the inspection wavelength reflectivity of 257 nm in the surface of the buffer layer 3 in the exposed region was 52.40%. This value was higher than a general approximate value, and thus contributed to the improvement of the inspection characteristic. On the other hand, the reflectivity at 257 nm on the surface of the light absorption laminated layer 4a in the absorption region was 1.85%. As a result, an excellent contrast of 93.2% was obtained between the surface reflected light of the buffer layer 3 and the surface reflected light of the light absorption laminated layer 4.

In the same manner as in example 1, the exposed buffer layer was removed, and a reflection type photomask according to the second aspect of the invention having the same configuration as in FIG. 13 was obtained except that the composition of the second light absorption layer 42a was different.

Herein, the buffer layer and the light absorption laminated layer were removed, and the inspection wavelength reflectivity of 257 nm in the exposed surface of the multilayer reflection film was 60%. On the other hand, the reflectivity at 257 nm on the surface of light absorption laminated layer was 1.02%, which is slightly lower than in the state of the reflection type photomask blank. As a result, an excellent contrast of 96.7% was obtained between the surface reflected light of the multilayer reflection film and the surface reflected light of the light absorption laminated layer.

As is clear from examples 1 to 3, according to the invention, since the light absorption laminated layer used in the reflection type photomask blank and the reflection type photomask is a lamination of the first light absorption layer low in EUV light exposure reflectivity, and the second light absorption layer low in resistance and low in DUV light exposure reflectivity, an excellent reflectivity contrast is obtained in a reflection region not only in pattern transfer exposure by EUV light exposure, but also in inspection exposure by DUV light. Therefore the inspection precision of the reflection type photomask and its pattern transfer precision are excellent. By performing EUV light exposure by using this reflection type photomask, a semiconductor device can be manufactured in fine patterns at higher precision.

What is claimed is:

1. A reflection type photomask blank comprising:
   a substrate;
   a multilayer reflection film provided on the substrate; and
   a light absorption laminated layer including a first light absorption layer, containing tantalum and silicon, provided on the multilayer reflection film and a second light absorption layer, containing tantalum by 2 to 7 at %, silicon by 40 to 60 at % and nitrogen by 6 to 15 at %, laminated on the first light absorption layer.

2. The reflection type photomask blank according to claim 1, wherein the second light absorption layer contains tantalum, silicon, nitrogen and oxygen, and has a damping coefficient smaller than 1 at a wavelength of 190 to 260 nm, and its sheet resistance is smaller than 50 $M\Omega/cm^2$.

3. The reflection type photomask blank according to claim 1, wherein the second light absorption layer has a surface roughness of 0.6 nm Rms or less.

4. The reflection type photomask blank according to claim 1, wherein the first light absorption layer contains silicon by 6 to 15 at %.

5. The reflection type photomask blank according to claim 1, wherein the first light absorption layer and the second light absorption layer are amorphous.

6. The reflection type photomask blank according to claim 1, wherein the light absorption laminated layer has a reflectivity of 13% or less in a deep ultraviolet ray region.

7. A reflection type photomask comprising: a reflection type photomask blank which includes:
   a substrate;
   a multilayer reflection film provided on the substrate; and
   a light absorption laminated Layer including a first light absorption layer, containing tantalum and silicon, provided on the multilayer reflection film and a second light absorption layer, containing tantalum by 2 to 7 at %, silicon by 40 to 60 at %, and nitrogen by 6 to 15 at %, laminated on the first tight absorption layer; and a pattern processed in the light absorption laminated layer of the reflection type photomask blank.

8. A method of manufacturing a semiconductor device comprising:
emitting extreme ultraviolet rays to a reflection type photomask comprising:
a reflection type photomask blank which includes;
a substrate;
a mulfilayer reflection film provided on the substrate; and
a light absorption laminated layer including a first light absorption layer, containing tantalum and silicon, provided on the multilayer reflection film and a second light absorption layer, containing tantalum by 2 to 7 at %, silicon by 40 to 60 at %, and nitrogen by 6 to 15 at %, laminated on the first light absorption layer; and
a pattern processed in the light absorption laminated layer of the reflection type photomask blank;
exposing a resist layer for extreme ultraviolet rays provided on a semiconductor substrate by a reflected light; and transferring a pattern.

9. A reflection type photomask blank comprising:
a substrate;
a multilayer reflection film provided on the substrate; and
a light absorption laminated layer including a first light absorption layer, containing tantalum and silicon, provided on the multilayer reflection film and a second light absorption layer, containing tantalum, oxygen, and, optionally, at least one of nitrogen and silicon, laminated on the first light absorption layer,
wherein the second light absorption layer contains a content of tantalum from 30 to 40 at %, and an atomic ratio of tantalum to oxygen is 1:1 to 1:2.

10. A reflection type photomask blank comprising:
a substrate;
a multilayer reflection film provided on the substrate; and
a light absorption laminated layer including a first light absorption layer, containing tantalum and silicon, provided on the multilayer reflection film and a second light absorption layer containing tantalum, oxygen, nitrogen, and, optionally, silicon laminated on the first light absorption layer,
wherein the second light absorption layer contains a content of tantalum from 20 to 40 at %, an atomic ratio of tantalum to oxygen is 3:2 to 9:1, and an atomic ratio of tantalum to nitrogen is 1:2 to 3:2.

11. A reflection type photomask blank comprising:
a substrate;
a multilayer reflection film provided on the substrate; and
a light absorption laminated layer including a first light absorption layer, containing tantalum and silicon, provided on the multilayer reflection film and a second light absorption layer containing tantalum, oxygen, and, optionally, at least one of nitrogen and silicon, laminated on the first light absorption layer,
wherein the second light absorption layer contains a content of tantalum from 40 to 90 at %, and an atomic ratio of tantalum to oxygen is 3:5 to 5:1.

* * * * *

UNITED STATES PATENT AND TRADEMARK OFFICE
CERTIFICATE OF CORRECTION

PATENT NO. : 7,838,177 B2
APPLICATION NO. : 11/808116
DATED : November 23, 2010
INVENTOR(S) : Koichiro Kanayama et al.

It is certified that error appears in the above-identified patent and that said Letters Patent is hereby corrected as shown below:

Column 16, line 58, delete claim 7,

"7. A reflection type photomask comprising: a reflection type photomask blank which includes:
   a substrate;
   a multilayer reflection film provided on the substrate; and
   a light absorption laminated Layer including a first light absorption layer, containing tantalum and silicon, provided on the multilayer, containing tantalum by 2 to 7 at %, silicon by 40 to 60 at %, and nitrogen by 6 to 15 at %, laminated on the first tight absorption layer; and
   a pattern processed in the light absorption laminated layer of the reflection type photomask blank."

and insert new Claim 7 as follows.

-- 7. A reflection type photomask comprising:
   a reflection type photomask blank which includes:
   a substrate;
   a multilayer reflection film provided on the substrate; and
   a light absorption laminated layer including a first light absorption layer, containing tantalum and silicon, provided on the multilayer reflection film and a second light absorption layer, containing tantalum by 2 to 7 at %, silicon by 40-60 at %, and nitrogen by 6 to 15 at %, laminated on the first light absorption layer; and
   a pattern processed in the light absorption laminated layer of the reflection type photomask blank. --

Column 17, line 3, delete claim 8:

"8. A method of manufacturing a semiconductor device comprising:
   emitting extreme ultraviolet rays to a reflection type photomask comprising:
   a reflection type photomask blank which includes;

Signed and Sealed this
Twenty-seventh Day of September, 2011

David J. Kappos
*Director of the United States Patent and Trademark Office* a substrate;
a multilayer reflection film provided on the substrate; and
a light absorption laminated layer including a first light absorption layer, containing tantalum and silicon, provided on the multilayer reflection film and a second light absorption layer, containing tantalum by 2 to 7 at %, silicon by 40 to 60 at %, and nitrogen by 6 to 15 at %, laminated on the first light absorption layer;
and
a pattern processed in the light absorption laminated layer of the reflection type photomask blank;
exposing a resist layer for extreme ultraviolet rays provided on a semiconductor substrate by a reflected light;
and transferring a pattern."

and insert new Claim 8:

-- 8. A method of manufacturing a semiconductor device comprising:
emitting extreme ultraviolet rays to a reflection type photomask comprising:
a reflection type photomask blank which includes:
a substrate;
a multilayer reflection film provided on the substrate; and
a light absorption laminated layer including a first light absorption layer, containing tantalum and silicon, provided on the multilayer reflection film and a second light absorption layer, containing tantalum by 2 to 7 at %, silicon by 40 to 60 at %, and nitrogen by 6 to 15 at %, laminated on the first light absorption layer; and
a pattern processed in the light absorption laminated layer of the reflection type photomask blank;
exposing a resist layer for extreme ultraviolet rays provided on a semiconductor substrate by a reflected light; and
transferring a pattern. --